SURFACE TREATMENT FOR SEMICONDUCTOR DEVICES

Filed July 29, 1964

INVENTOR.
Takashi Tokuyama
Keijiro Uehara
BY
Mahon & Mahon

United States Patent Office 3,447,237

Patented June 3, 1969

3,447,237
SURFACE TREATMENT FOR SEMICONDUCTOR DEVICES

Takashi Tokuyama and Keijiro Uehara, Tokyo-to, Japan, assignors to Kabushiki Kaisha Hitachi Seisakusho, Chiyoda-ku, Tokyo-to, Japan, a joint-stock company of Japan Filed July 29, 1964, Ser. No. 386,017
Claims priority, application Japan, Aug. 1, 1963, 38/40,209
Int. Cl. H01l 7/62
U.S. Cl. 29—590 5 Claims

ABSTRACT OF THE DISCLOSURE

A process for the production of semiconductor devices whereby a silicon oxide film is formed on a surface of a semiconductor substrate, followed by deposition of a layer of lead on said film. This combination then is heated at 500–700° C. for at least 10 minutes in an oxidizing atmosphere, whereby a passivating film forms consisting essentially of silicon oxide and lead oxide. The temperatures employed are substantially lower than those conventionally used and prevent deterioration of the device.

Figure 1:
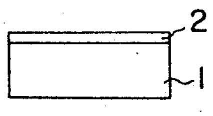

This invention relates to semiconductor devices, and more particularly it relates to improvement of surface passivation of semiconductor devices, particularly those wherein silicon is used.

The general objects of this invention are to decrease the processing temperature for the oxide films on the surfaces of silicon devices, to increase the moisture resistance of the oxide films so formed, and to decrease as much as possible changes in the characteristics of the devices which frequently occur during the formation of their oxide films.

Heretofore, the common practice for the purpose of surface passivation of silicon semiconductor devices has been to carry out oxidation of the surfaces of silicon devices in oxygen or steam at a temperature of 1,000° C. or higher to form films of $SiO_2$ on the surfaces, these films being utilized as protective films. An example of a semiconductor device produced by skillful use of this method is the planar type transistor. In the fabrication of this transistor, an opening is made by a method such as etching in one part of the oxide film obtained by the above mentioned method on the entire surface of a silicon element, and through this opening an active impurity is caused to diffuse from its vapor phase into the bulk semiconductor material.

Furthermore, there had been a recent report disclosing that by carrying out the oxidation of a silicon semiconductor surface, in this case in an atmosphere of lead monoxide (PbO), the oxidation reaction is accelerated, the reaction temperature can be decreased, and, moreover, a resulting oxide film having excellent features such as high moisture resistance can be obtained.

However, by a conventional method, for example, the above mentioned high-temperature oxidation method, internal impurity diffusion due to the high-temperature at the time of formation of the oxide film occurs in a semiconductor element in the interior of which a p-n junction has been formed beforehand. This impurity diffusion causes destruction of the structure of the p-n junction and deterioration of the electrical characteristics of the device. Therefore, application of such a method is difficult. Moreover, the characteristics of the semiconductor surface below the $SiO_2$ film formed by a high-temperature oxidation method are converted to a great extent toward those of the n-type. As a result, the reverse breakdown voltage of the semiconductor device decreases, and increase in leak current and other adverse effects arise.

By the method wherein lead monoxide (PbO) is used, the above described disadvantages can be eliminated to a great extent, however, the actual process of creating an atmosphere of lead monoxide within the treatment furnace and controlling the vapor pressure thereof is difficult.

We have found through experiments that a method comprising pyrolitic decomposition of organo-oxysilane to cause a $SiO_2$ film to adhere to the surface of a silicon device can be carried out at a relatively low temperature, resulting in a lesser degree of conversion to the n-type of the semiconductor surface below the film, and is superior to the aforementioned thermal oxidation method. However, the properties of the oxide film so formed do not differ greatly from those of a film formed by the thermal oxidation method, and the properties such as moisture-resistance cannot be said in all cases to be fully adequate for long life and high reliability of the semiconductor device.

With the problems of the conventional methods, that is, the lowering as much as possible of the temperature for forming the oxide film, the formation of an oxide film with good moisture resistant properties, and the reduction of the variations in characteristics of semiconductor devices due to the oxide film, in view, the present invention contemplates the provision of a surface treatment method for semiconductor devices which, in comparison with conventional methods, requires a simpler process, has a wider range of applications, and moreover, produces performance results which are the same or superior.

The present invention is based on the fact that lead or lead monoxide greatly accelerates the oxidation reaction of silicon and the fact that silicon dioxide ($SiO_2$) and lead or lead monoxide react at an extremely low temperature. The physical principles of these two phenomena are not yet clear, but regarding the reaction of the former phenomenon, it may be considered that silicon atoms are substituted by lead atoms and, readily separated from the lattice, oxidized by the outside atmosphere, whereby a $SiO_2$ film is formed. Regarding the latter phenomenon, it may be considered that a solid solution of $SiO_2$ and PbO is probably formed at a substantially low temperature.

In accordance with the above described phenomena, the present invention resides in a surface treatment method comprising the steps of first providing a $SiO_2$ film on a silicon substrate, causing lead to be deposited by evaporation on this film, and heating the resulting device in an oxygen gas atmosphere to form an oxide film on the silicon semiconductor base surface; or the steps of forming a $SiO_2$ film on the surface of a silicon semiconductor device, depositing lead by evaporation thereon, carrying out the oxidation thereafter in an atmosphere of oxygen and an organo-oxysilane, and, at the same time as this oxidation, causing also the $SiO_2$ produced by the pyrolitic decomposition of silane to react.

In either case, the reaction temperature is in the range from 500 to 700° C. Although the reaction progresses even at 500° C., a higher surrounding temperature results in a more uniform finished state of the oxide film. By either method, moreover, the properties of the resulting film are superior to those of the semiconductor oxide protective film obtained by conventional methods in which lead is not used, and when either method is applied to a semiconductor device, its life is prolonged. Furthermore, there is extremely little deterioration in the characteristic of the element due to the formation of the film.

Figure 2:
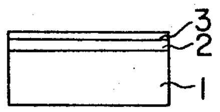
Figure 3:
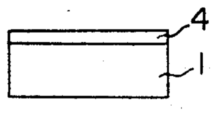

The specific nature of the invention will be more clearly apparent by reference to the following description with respect to embodiments of the invention, when taken in conjunction with the accompanying drawing in which like parts are designated by like reference numerals, and in which:

FIGURES 1 through 3, inclusive, are sectional views indicating one example of embodiment of the method according to the invention and showing the process of treating the surface of a silicon semiconductor substrate; and FIGURES 4 through 7, inclusive are similar sectional views indicating another example of embodiment of the invention and showing the process of treating the surface of a mesa-type silicon diode.

The process of forming an oxide film in accordance with one embodiment of the method of this invention on the surface of a silicon semiconductor substrate is shown in FIGURES 1 through 3. Referring to FIGURE 1, there is shown a substrate in the form of an n-type disk wafer 1 of a resistivity of approximately 100 ohm. cm., which has a diameter of 25 mm. and a thickness of 0.1 mm. and has a surface which has been made flat by chemical etching.

This wafer is heated for 30 minutes in a heat treatment furnace at 700° C. in an atmosphere of tetraethoxysilane vapor and nitrogen gas. As a result of this treatment, a $SiO_2$ film 2 of approximately 1-micron thickness is formed on one surface of the silicon wafer.

Next, this wafer with the oxide film formed thereon is placed in a vacuum evaporation apparatus of known type which has been evacuated to approximately $10^{-3}$ mm. Hg, and lead is deposited by evaporation to a thickness of approximately 0.05 to 0.1 micron on the $SiO_2$ film 2 on the silicon wafer to form a lead layer 3 as shown in FIGURE 2, which indicates the state of the element after this evaporation step.

Then, the element is again placed in the heat treatment surface and heated for 10 minutes at a temperature of 700° C. in an atmosphere of oxygen gas. The constructional state of resulting element is shown in FIGURE 3, in which the region designated by reference numeral 4 is a region consisting of a new film formed by the reaction of the deposited lead with the previously formed $SiO_2$ film.

The boundary region between the $SiO_2$ film and the Pb film is continuous, and the resultant effect is that the film thickness of the silicon dioxide $SiO_2$ constituting the sublayer below the deposited lead is increased. In the film thickness formed in this manner in the film 4, the reaction of the silicon atoms of the part below the film 2 as shown in FIGURE 1 is newly accelerated to form an oxide film because of the presence of lead oxide formed as a result of the reaction between the oxygen and the lead in the surrounding atmosphere, and lead atoms are contained in said film 4.

Since this film 4 contains lead, its mechanical strength, moisture resistance, and other properties are greatly improved over those of a film consisting merely of $SiO_2$. For example, in the case of a conventional combination of an $SiO_2$ film and a substrate silicon, a film thickness of 3 microns or more gives rise to many cracks because of the difference between the coefficients of thermal expansion of the two regions. In contrast, in semiconductor devices treated according to the present invention, such cracks have never been observed.

Furthermore, the interface between the sublayer substrate 1 and the film 4, formed because the silicon substrate surface below the $SiO_2$ film is caused by the presence of lead to undergo oxidation reaction, is now different from the interface between the $SiO_2$ film and the initial surface of the substrate 1, being a new face of silicon atoms. For this reason, lattice defect impurities such as those which existed previously no longer exist in the new interface, and a surface of new and fresh atoms, as though it were chemically etched, appears, an oxide film being simultaneously formed on this surface. Accordingly, in cases such as that when a film is to be caused by the method of this invention to adhere to the surface of p-n junction, there is further advantage of no formation of channels near the junction and of almost no change, before and after treatment, in the characteristics such as the breakdown voltage.

Figure 4:
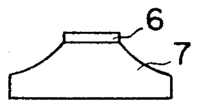
Figure 5:
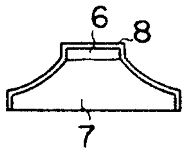
Figure 6:
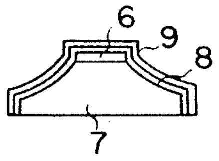

Another embodiment of the invention may be described with respect to its application to a mesa-type semiconductor device. Referring to FIGURE 4, the element shown therein is a diode element obtained by causing boron constituting a p-type impurity to diffuse in one surface of a thin piece of n-type silicon of 100 ohm cm. resistivity and then, by a known method, fabricating a mesa-type element. The resulting element consists of a p-type silicon region 6 and an n-type silicon region 7. The diameter of the mesa, top of the region 6 is 0.8 mm., the bottom of the region 7 has the dimensions of 1.5 mm. x 1.5 mm., and the finished thickness is approximately 0.25 mm.

Figure 7:
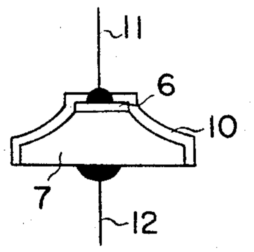

In the treatment of this diode element, it is first heated at 700° C. in an atmosphere consisting of mixture of tetraethoxysilane vapor and nitrogen. After approximately 30 minutes of heating, an $SiO_2$ film (as designated by reference numeral 8 in FIGURE 5) of 1-micron thickness is deposited on the element. Next, on the resulting element, lead (as designated by reference numeral 9 in FIGURE 6) is deposited by evaporation to a thickness of the order of from 0.05 to 0.1 micron in a vacuum of approximately $10^{-3}$ mm. Hg by a known vacuum evaporation method. The resulting element is then heated at 700° C. in an atmosphere of oxygen for 30 minutes, whereupon the lead film 9 and the $SiO_2$ film 8 become integrated and also react with parts of the regions 6 and 7 to form an oxide film 10 as shown in FIGURE 7. Finally, an opening is formed by a known method in the oxide film on the upper surface of the element so obtained, and an electrode 11 is bonded onto the region 6, while an electrode 12 is bonded onto the bottom face of the region 7. As a result, a unit diode element is obtained.

When several tens of these diodes were made according to the above described process, it was found that the average value of their breakdown voltages was approximately 700 volts. The average value of breakdown voltages of similar diodes in the case where elements were heated in tetraethoxysilane, and only an $SiO_2$ film was caused to adhere according to known practice was found to be approximately 400 volts. These comparative results clearly indicate that the breakdown voltage of a semiconductor device is substantially improved by the method of the present invention.

As a further test, unit diode elements treated according to the method of the invention were subjected to a life test at 75° C. in air with a relative humidity of 90 percent, whereupon results which were far superior to those obtainable by similar diodes having only $SiO_2$ films as in conventional semiconductor devices were obtained. More specifically, the average value of the breakdown voltages after 1,000 hours of the life test treatment was found to be almost the same as that prior to the treatment. This result confirms the fact that the oxide film produced by the method of this invention is not merely an $SiO_2$ film but a film which is superior thereto in the property of moisture resistance.

As is apparent from the foregoing two specific examples of practice of the invention, the present invention provides a method whereby an excellent protective film for silicon semiconductor devices is produced with a heating temperature of approximately 700° C., whereas, by conventional methods, a protective film (oxide film) is formed by heating at a temperature of 1,000° C. or higher. Furthermore, in comparison with a protective film formed by the silane decomposition method, the protective film produced by the method of the present invention at the same temperature has a greater thickness, and the properties of the film so produced are superior. In addition, the present invention affords a method which has distinctive features such greater simplicity and, moreover, greater facility of control than the method wherein lead monoxide is used to form the protective film.

While the present invention has been described hereinabove with respect to specific embodiments thereof, it will be obvious, of course, that the invention can be also practiced with various changes and modifications of the examples as herein described.

For example, by causing oxygen and the vapor of organo-oxysilane such as tetraethoxysilane to flow simultaneously after the deposition of lead, the resulting effect is that of supplying $SiO_2$ from theo utside, whereby it is possible to make the oxide film formed substantially thick. As another method of forming the lead coating, the depositing of lead by plating is also possible. Furthermore, the deposition of the initial $SiO_2$ film is not limited to only that by pyrolitic decomposition of silane as in the case of the above described examples, other methods such as those utilizing a high-temperature oxidizing atmosphere, high-pressure steam, and electrolysis producing equal effect in improving the properties of the oxide film.

We claim:

1. A method for treating surfaces of semiconductor devices which comprises forming on a selected surface of a semiconductor substrate, a film of silicon oxide, depositing on the film of silicon oxide a layer of lead of selected quantity, and then heating the combination thus produced in an oxidizing atmosphere at such a time and temperature which will cause a reaction between said film of silicon oxide and all of said lead, thus forming a film consisting essentially of silicon oxide and lead oxide.

2. A method for treating surfaces of semiconductor devices which comprises forming on a selected surface of a semiconductor substrate, a film of silicone oxide depositing on the silicon oxide a layer of lead of selected quantity, heating the combination thus produced in an oxidizing atmosphere containing at least an organo-oxysilane and oxygen, at such a temperature which will cause decomposition of said silane as well as a reaction between silicon oxide and oxidized lead in order to cause reaction between the oxygen and the lead, oxides on the semiconductor substrate, and products such as silicon oxide which result from the pyrolitic decomposition of the organo-oxysilane, and thereby to form on the semiconductor substrate a protective layer consisting essentially of silicon oxide and lead oxide.

3. A method of producing semiconductor devices which comprises the steps of: forming a film of silicon oxide on a surface of a semiconductor substrate; depositing on said film a layer of lead having a thickness of 0.05 to 0.1 micron; heating the combination thus formed at a temperature of 500 to 700 degrees centigrade in an oxidizing atmosphere for at least 10 minutes to form a passivating film consisting substantially of silicon oxide and lead oxide; forming a hole through said passivating film to expose a part of the surface of said semiconductor substrate; and connecting an electrode to the exposed surface of said semiconductor substrate through said hole.

4. The method according to claim 3, wherein said oxidizing atmosphere contains an organo-oxysilane, said organo-oxysilane being thermally decomposed at the same time with the oxidation of said lead.

5. The process according to claim 3, wherein the lead is deposited by evaporation in a vacuum.

References Cited

UNITED STATES PATENTS

| | | | |
|---|---|---|---|
| 3,114,663 | 12/1963 | Klerer | 117—201 |
| 3,158,505 | 11/1964 | Sandor | 117—118 X |
| 3,242,007 | 3/1966 | Jensen | 117—201 |
| 3,300,339 | 1/1967 | Perri et al. | 117—201 X |
| 3,301,706 | 1/1967 | Flaschen et al. | 117—215 |

WILLIAM L. JARVIS, *Primary Examiner.*